(12) United States Patent
Tokuda et al.

(10) Patent No.: US 9,747,837 B2
(45) Date of Patent: Aug. 29, 2017

(54) ORGANIC ELECTROLUMINESCENT DISPLAY DEVICE

(71) Applicants: Japan Display Inc., Tokyo (JP); Panasonic Liquid Crystal Display Co., Ltd., Hyogo-ken (JP)

(72) Inventors: Naoki Tokuda, Mobara (JP); Hiroshi Kageyama, Mobara (JP); Masamitsu Furuie, Mobara (JP)

(73) Assignees: Japan Display Inc., Tokyo (JP); Panasonic Liquid Crystal Display Co., Ltd., Hyogo-Ken (JP)

( * ) Notice: Subject to any disclaimer, the term of this patent is extended or adjusted under 35 U.S.C. 154(b) by 0 days.

(21) Appl. No.: 15/235,991

(22) Filed: Aug. 12, 2016

(65) Prior Publication Data
US 2017/0039938 A1   Feb. 9, 2017

Related U.S. Application Data

(63) Continuation of application No. 14/883,021, filed on Oct. 14, 2015, now Pat. No. 9,489,890, which is a (Continued)

(30) Foreign Application Priority Data

Feb. 27, 2006   (JP) .................................. 2006-051235

(51) Int. Cl.
*H05B 37/00* (2006.01)
*G09G 3/3233* (2016.01)
(Continued)

(52) U.S. Cl.
CPC ......... *G09G 3/3233* (2013.01); *G09G 3/3266* (2013.01); *H01L 27/3276* (2013.01); *H01L 51/5225* (2013.01); *H05B 33/04* (2013.01); *H05B 33/08* (2013.01); *G09G 2320/0233* (2013.01); *G09G 2320/0257* (2013.01); *G09G 2320/0266* (2013.01); *G09G 2330/00* (2013.01); *G09G 2330/02* (2013.01); *H01L 2251/5338* (2013.01)

(58) Field of Classification Search
USPC ..... 315/160, 161, 164, 167, 169.4; 345/211, 345/212
See application file for complete search history.

(56) References Cited

U.S. PATENT DOCUMENTS 6,903,513 B2   6/2005 Choi et al.

FOREIGN PATENT DOCUMENTS

JP   2002108252   4/2002
JP   2004349064   12/2004

*Primary Examiner* — Douglas W Owens
*Assistant Examiner* — Jianzi Chen
(74) *Attorney, Agent, or Firm* — Juan Carlos A. Marquez; Marquez IP Law Office, PLLC

(57) ABSTRACT

The present invention overcomes image defects such as the brightness inclination or smears by reducing the line resistance of a power source bus line which supplies electricity to organic EL elements. A plurality of pixels which are arranged in a matrix array is connected to power source lines, and the plurality of power source lines are connected to a power source bus line. Both ends of the power source bus line are connected to a power source part via a FPC. By supplying electricity to both ends of the power source bus line from the power source part, the line resistance of the power source bus line can be reduced.

18 Claims, 8 Drawing Sheets

Related U.S. Application Data continuation of application No. 14/295,055, filed on Jun. 3, 2014, now Pat. No. 9,189,993, which is a continuation of application No. 14/109,033, filed on Dec. 17, 2013, now Pat. No. 8,773,025, which is a continuation of application No. 13/733,219, filed on Jan. 3, 2013, now Pat. No. 8,624,507, which is a continuation of application No. 13/542,150, filed on Jul. 5, 2012, now Pat. No. 8,368,311, which is a continuation of application No. 11/710,944, filed on Feb. 27, 2007, now Pat. No. 8,242,698.

(51) Int. Cl.
*H01L 27/32* (2006.01)
*H05B 33/08* (2006.01)
*H05B 33/04* (2006.01)
*H01L 51/52* (2006.01)
*G09G 3/3266* (2016.01)

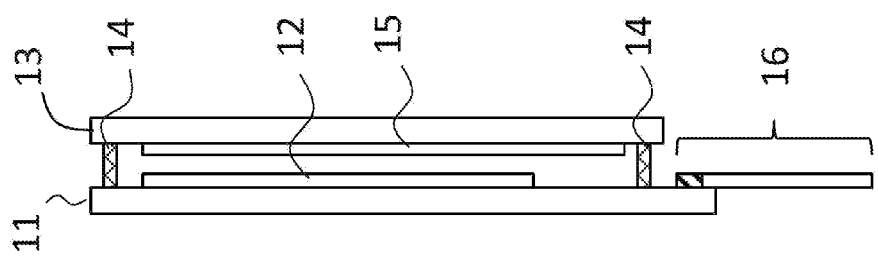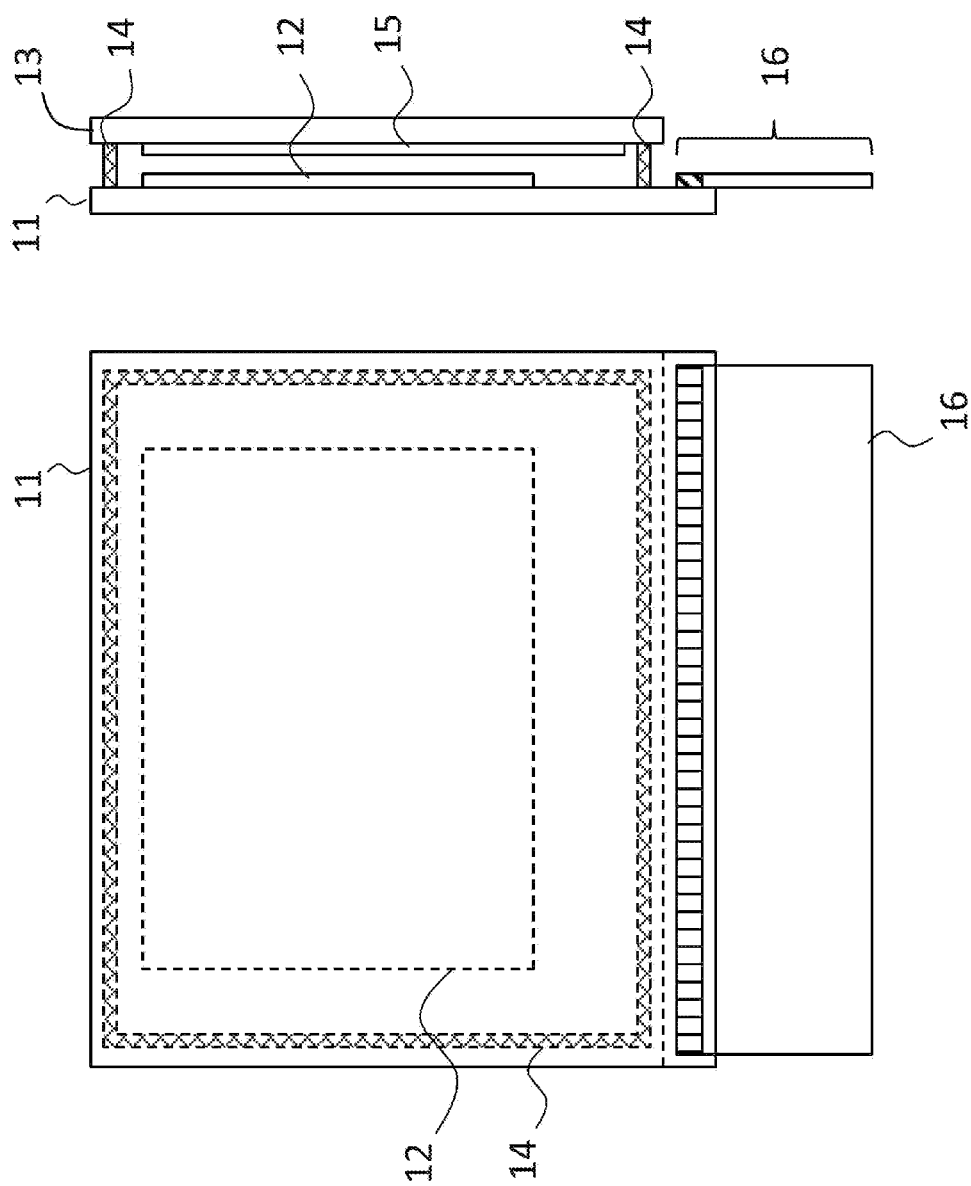

ORGANIC ELECTROLUMINESCENT DISPLAY DEVICE

CROSS-REFERENCE TO RELATED APPLICATIONS

This application is a Continuation of U.S. application Ser. No. 14/883,021 filed on Oct. 14, 2015, which is a Continuation of U.S. application Ser. No. 14/295,055 filed on Jun. 3, 2014, which is a Continuation of U.S. application Ser. No. 14/109,033 filed on Dec. 17, 2013, which is a continuation of U.S. application Ser. No. 13/733,219 filed on Jan. 3, 2013, which is a Continuation of U.S. application Ser. No. 13/542,150 filed on Jul. 5, 2012, which is a Continuation of U.S. application Ser. No. 11/710,944 filed on Feb. 27, 2007. Priority is claimed based on U.S. application Ser. No. 14/883,021 filed on Oct. 14, 2015, which claims priority from U.S. application Ser. No. 14/295,055 filed on Jun. 3, 2014, which claims priority from U.S. application Ser. No. 14/109,033 filed on Dec. 17, 2013, which claims priority from U.S. application Ser. No. 13/733,219 filed on Jan. 3, 2013, which claims priority from U.S. application Ser. No. 13/542,150 filed on Jul. 5, 2012, which claims priority from U.S. application Ser. No. 11/710,944 filed on Feb. 27, 2007, which claims priority from Japanese application JP 2006-051235 filed on Feb. 27, 2006, which is hereby incorporated by reference into this application.

BACKGROUND

Field of the Invention

The present invention relates to an organic EL display device which uses organic EL elements as pixels, and more particularly to an improved power source wiring which supplies electricity for allowing the organic EL elements to emit light.

Description of the Related Art

An organic EL element is a current-light-emitting-type element which emits light when an electric current flows therethrough, wherein a large current of several tens to 100 mA flows in a power source line in the inside of a TFT substrate on which the organic EL elements are formed. Particularly, in performing fixed-voltage driving of an EL display panel, when electricity is supplied to respective pixels via the power source line in the inside of the TFT substrate from a terminal at an inlet of the display panel, due to a voltage drop which is generated attributed to the resistance of the power source line, image defects such as the brightness inclination, smears and the like are generated. Accordingly, it is necessary to reduce the resistance of the power source line in the inside of the TFT substrate (from the inlet of the display panel to the respective pixels).

With respect to the reduction of the power source resistance, in following patent document 1, there is described a technique in which, for lowering a voltage drop attributed to the resistance of a drive power source line which drives a plurality of organic EL elements arranged in a matrix array, auxiliary power source lines are connected to both ends (and an intermediate portion) of a drive power source line.

Patent document 1: JP-A-2003-108068

SUMMARY

In the above-mentioned patent document 1, although the voltage drop of the drive power source line which is connected to a plurality of organic EL elements is lowered, a voltage drop of the auxiliary power source lines which are connected to the plurality of drive power source lines is not taken into consideration.

Accordingly, it is an object of the present invention to provide an organic EL display device which reduces a voltage drop of a power source bus line which supplies electricity to a power source line which is connected to a plurality of organic EL elements.

The present invention is directed to an organic EL display device which includes a power source line which is connected to a plurality of organic EL elements and a power source bus line which is connected to the power source line, wherein electricity is supplied to a plurality of portions including both ends of the power source bus line or both ends of the power source bus line.

According to the present invention, it is possible to obtain the organic EL display device which can reduce the voltage drop attributed to the line resistance of the power source bus line which supplies electricity to the power source line of the organic EL elements thus effectively overcoming image defects such as the brightness inclination, smears or the like attributed to the power source bus line.

The display device according to the present invention is applicable to a TV receiver set, a PC monitor, a notebook type PC, a PDA, a mobile phone, a digital still camera, a digital video camera, a car navigation monitor and the like. Further, the display device according to the present invention is also applicable to other self-luminous light-emitting-type display.

BRIEF DESCRIPTION OF THE DRAWINGS

FIGS. 1A and 1B are front and cross-sectional general appearance views of an organic EL display device according to the present invention;

DETAILED DESCRIPTION OF THE INVENTION

Figure 2:
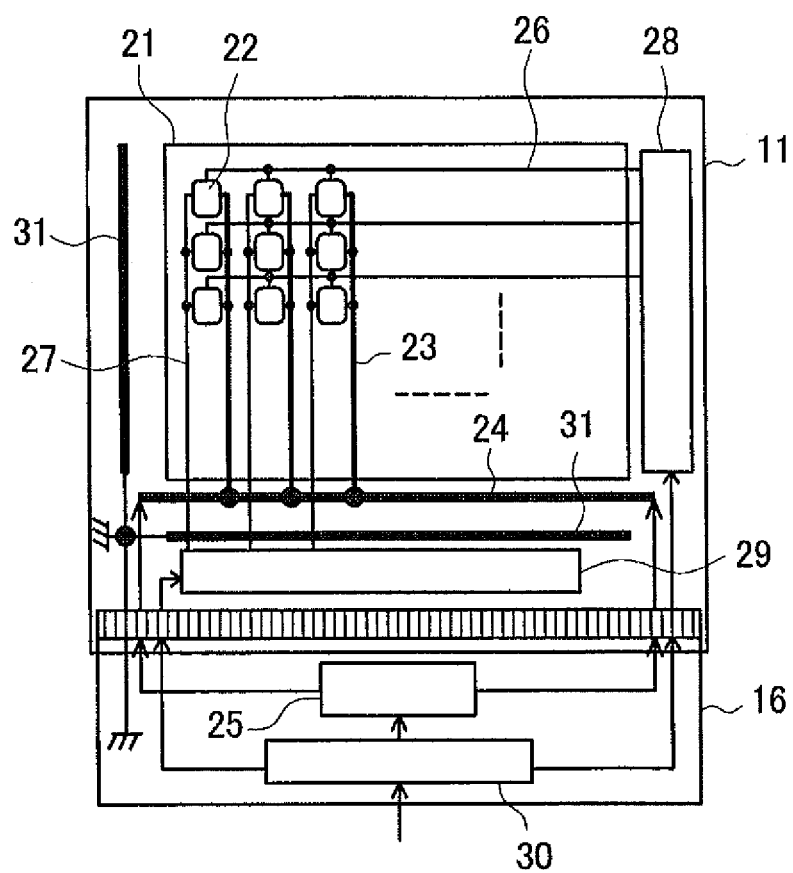
FIG. 2 is a drive circuit diagram of the organic EL display device of an embodiment 1 shown in FIG. 1A.

Hereinafter, the present invention is explained in conjunction with embodiments by reference to drawings.

Embodiment 1

FIG. 1A and FIG. 1B are general appearance views of an organic EL display device according to the present invention, wherein FIG. 1A is a front view and FIG. 1B is a cross-sectional view. In FIG. 1A and FIG. 1B, a pixel part 12 is formed on a TFT substrate (display panel) 11, and the pixel part 12 is sealed by the TFT substrate 11, a sealing substrate 13 which faces the TFT substrate 11, and a sealing material 14. In a sealed space, for preventing the degradation of organic EL elements in the pixel part 12 attributed to moisture, a desiccant material 15 is sealed. Further, on the TFT substrate 11, a FPC (Flexible Printed Circuit) 16 for supplying signal for driving the organic EL elements and for supplying electricity from a power source part is mounted.

FIG. 2 is a drive circuit diagram of the organic EL display device shown in FIG. 1A. In FIG. 2, pixels 22 each of which is formed of the organic EL element are arranged in a matrix array in a display region 21. The plurality of pixels 22 are connected to power source lines 23 and the plurality of power source lines 23 are connected to a power source bus line 24. Both ends of the power source bus line 24 are connected to a power source part 25 via the FPC 16. In this manner, the organic EL elements in the pixels 22 emit light with the electricity supplied to both ends of the power source bus line 24 from the power source part 25.

Further, the plurality of pixels 22 which are arranged in a matrix array are connected to scanning lines 26 and data lines 27, and are driven in response to scanning signals of the scanning lines 26 selected by a scanning line drive circuit 28 and data signals from the data lines 27 which are connected to a data line drive circuit 29.

A display control part 30 receives signals from the outside and supplies the scanning signals and the data signals to the scanning line drive circuit 28 and the data line drive circuit 29 via the FPC 16 and, at the same time, controls the power source part 25. Although the power source part 25 and the display control part 30 are mounted on the FPC 16 in the drawing, it is not always necessary to mount the power source part 25 and the display control part 30 on the FPC 16.

Here, a cathode contact 31 is connected to cathodes of the organic EL elements in the pixels 22, wherein the cathode contact 31 is grounded to the TFT substrate 11 and, at the same time, is grounded to the FPC 16 via the FPC 16.

Figure 3:
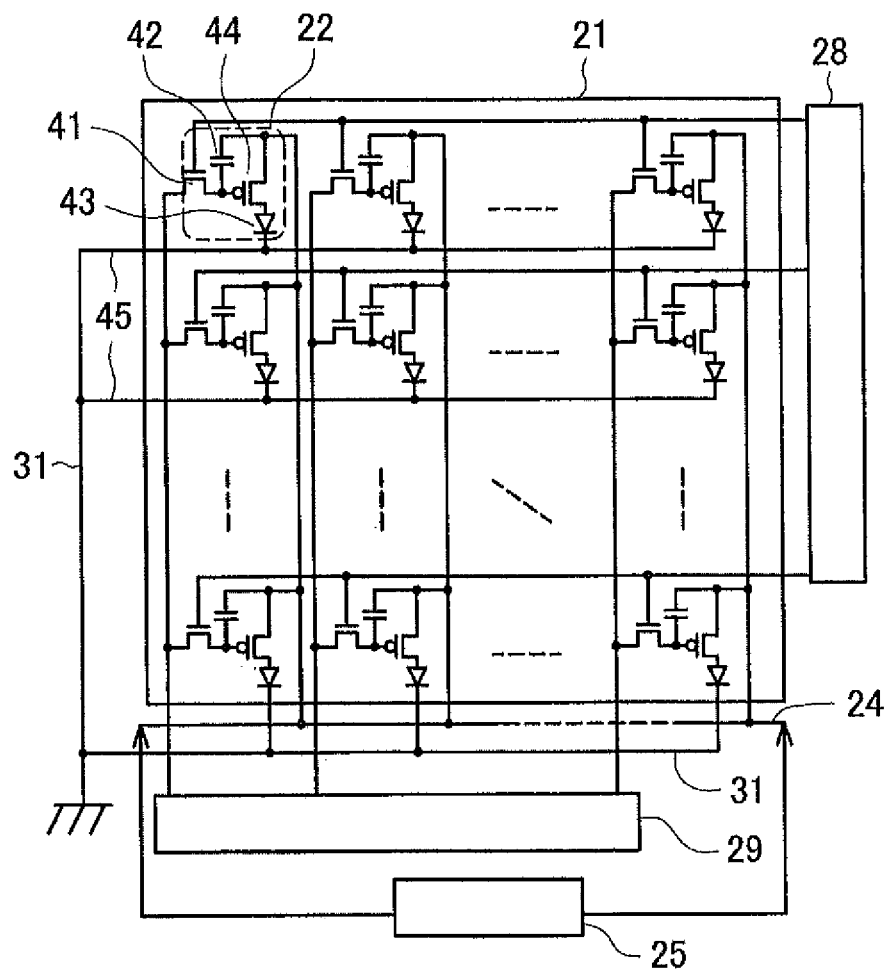
FIG. 3 is a detailed view of a pixel made of an organic EL element shown in FIG. 2.

FIG. 3 is a detailed view of the pixels 22 each of which is constituted of the organic EL element shown in FIG. 2. In FIG. 3, in each one of the plurality of pixels 22 arranged in the inside of the display region 21, a switching TFT 41 which is selected by the scanning line drive circuit 28 and acquires the data signals from the data line drive circuit 29, a capacitance 42 which stores the data signals, and a driver TFT 44 which drives the organic EL element 43 in response to the data signals are provided. The power source part 25 is connected to both ends of the power source bus line 24.

The organic EL element 43 has an anode side thereof connected to the driver TFT 44 and a cathode side thereof connected to a cathode current line 45 which holds a reference potential (ground potential), and the cathode current line 45 is connected to the cathode contact 31.

In this embodiment, electricity is supplied from both ends of the power source bus line 24 and hence, compared to the supply of electricity from one terminal, it is possible to lower a voltage drop attributed to the line resistance of the power source bus line 24. By lowering the voltage drop in this manner, it is possible to reduce the brightness inclination in the horizontal direction of the horizontal power source bus line 24. Here, the brightness inclination in the vertical direction attributed to the voltage drop of the vertical power source line 23 is ignored.

Embodiment 2

Figure 4:
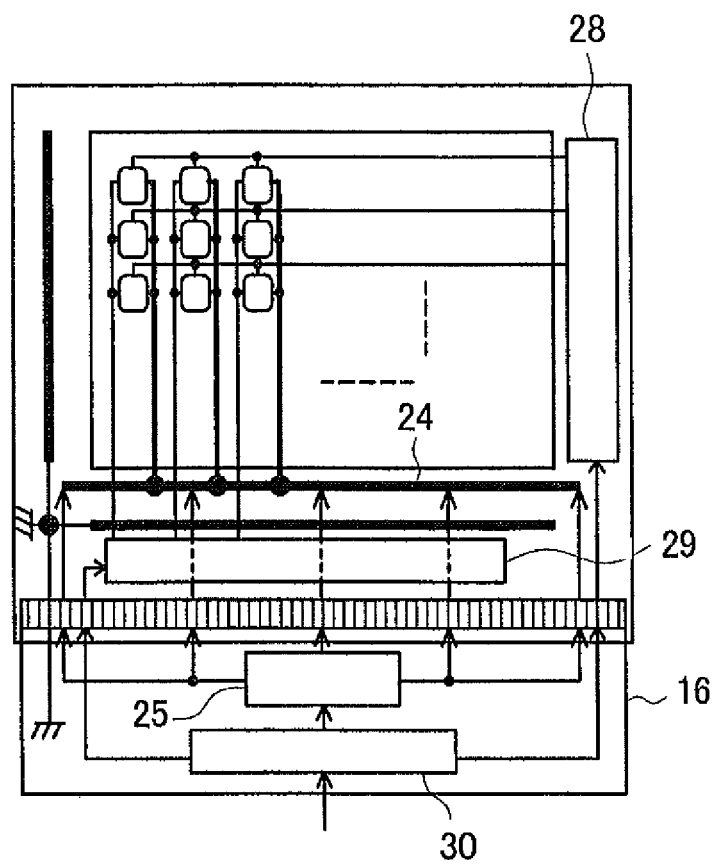
FIG. 4 is a drive circuit diagram of an organic EL display device of the second embodiment.

FIG. 4 is a drive circuit diagram of an organic EL display device of an embodiment 2 corresponding to FIG. 2 of the embodiment 1. The constitution which makes this embodiment differ from the embodiment 1 lies in that electricity is supplied to a plurality of portions including both ends of the power source bus line 24. Since other constitutions are substantially equal to the corresponding constitutions shown in FIG. 2, the detailed explanation is omitted.

In FIG. 4, electricity is supplied to the plurality of portions (five portions) including both ends of the power source bus line 24 from a power source part 25 on the FPC 16 side. By supplying electricity to the plurality of portions in this manner, the line resistance of the power source bus line 24 is divided thus achieving the substantial reduction of line resistance.

In this embodiment, compared to the embodiment 1, a voltage drop attributed to the line resistance of the power source bus line 24 can be further lowered thus further reducing the brightness inclination.

Embodiment 3

Figure 5:
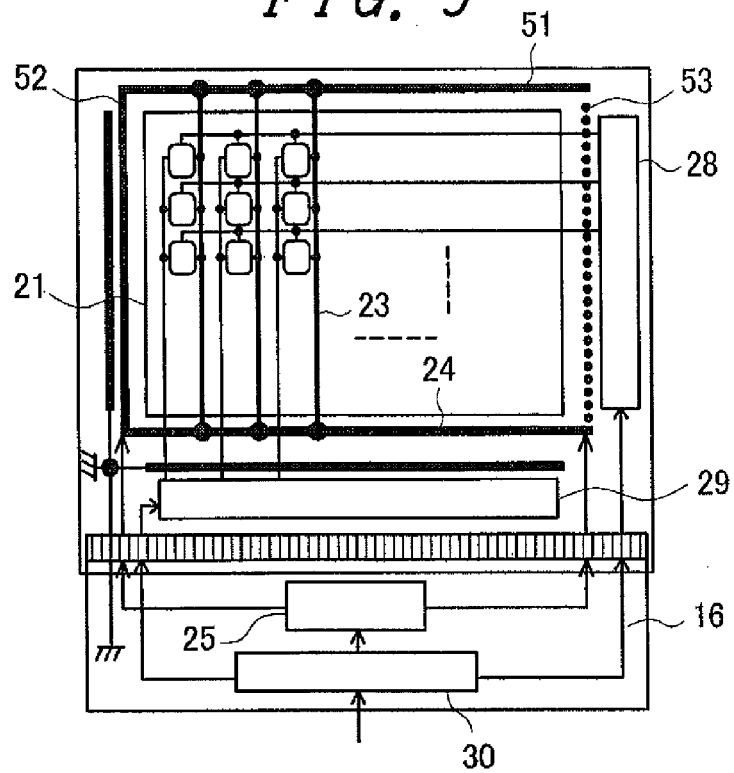
FIG. 5 is a drive circuit diagram of an organic EL display device of the third embodiment.

FIG. 5 is a drive circuit diagram of an organic EL display device of an embodiment 3 corresponding to FIG. 2 of the embodiment 1. The constitution which makes this embodiment differ from the embodiment 1 lies in that a drive circuit includes an upper power source bus line 51 and left and right power source bus lines 52, 53. Since other constitutions are substantially equal to the corresponding constitutions shown in FIG. 2, the detailed explanation is omitted.

In FIG. 5, one ends of a plurality of power source lines 23 are connected to a lower power source bus line 24, and another ends of the plurality of power source lines 23 are connected to the upper power source bus line 51. Further, the lower power source bus line 24 and the upper power source bus line 51 are connected with the left power source bus line 52. Further, the right power source bus line 53 may be connected to the lower power source bus line 24 and the upper power source bus line 51 so as to surround the display region 21 with these power source bus lines.

Electricity is supplied to both ends of the power source bus line 24 from a power source part 25 on the FPC 16 side and, at the same time, electricity is also supplied to the upper power source bus line 51 via the left power source bus line 52 (and the right power source bus line 53). By supplying electricity from both ends of the power source line 23 in this manner, it is possible to lower a voltage drop of the power source line 23.

In this embodiment, along with the lowering of the voltage drop of the power source bus line 24, the voltage drop of the power source line 23 can be lowered and hence, the brightness inclination in the horizontal direction can be reduced in the same manner as the embodiment 1 and, further, the brightness inclination in the vertical direction attributed to the line resistance of the power source line 23 can be also reduced.

Embodiment 4

Figure 6:
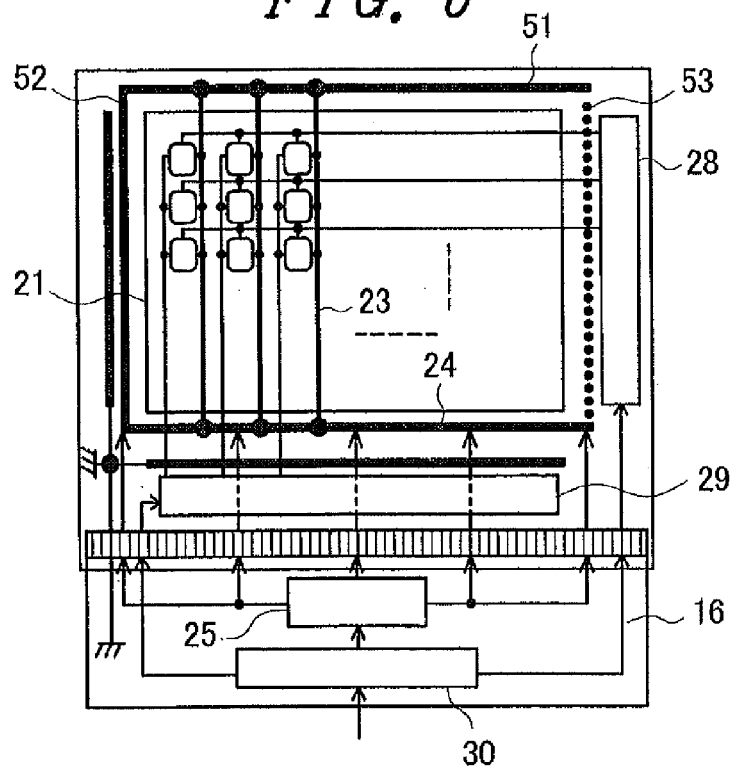
FIG. 6 is a drive circuit diagram of an organic EL display device of the fourth embodiment.

FIG. 6 is a drive circuit diagram of an organic EL display device of an embodiment 4 corresponding to FIG. 4 of the embodiment 2. The constitution which makes this embodiment differ from the embodiment 2 lies in, in the same manner as FIG. 5 of the embodiment 3, that a drive circuit includes an upper power source bus line 51 and left and right power source bus lines 52, 53. Since other constitutions are substantially equal to the corresponding constitutions shown in FIG. 4, the detailed explanation is omitted.

In FIG. 6, electricity is supplied to a plurality of portions (five portions) including both ends of the power source bus line 24 from a power source part 25 on the FPC 16 side and, at the same time, electricity is also supplied to the upper power source bus line 51 via the left power source bus line 52 (and the right power source bus line 53). By supplying electricity to both ends of the power source line 23 from the power source bus line 24 and the upper power source bus line 51, a voltage drop of the power source line 23 is lowered.

In this embodiment, along with the further lowering of the voltage drop of the power source bus line 24, the voltage drop of the power source line 23 can be also lowered and hence, the brightness inclination in the horizontal direction can be further reduced in the same manner as the embodiment 2, the brightness inclination in the vertical direction attributed to the line resistance of the power source line 23 can be also reduced.

Embodiment 5

Figure 7:
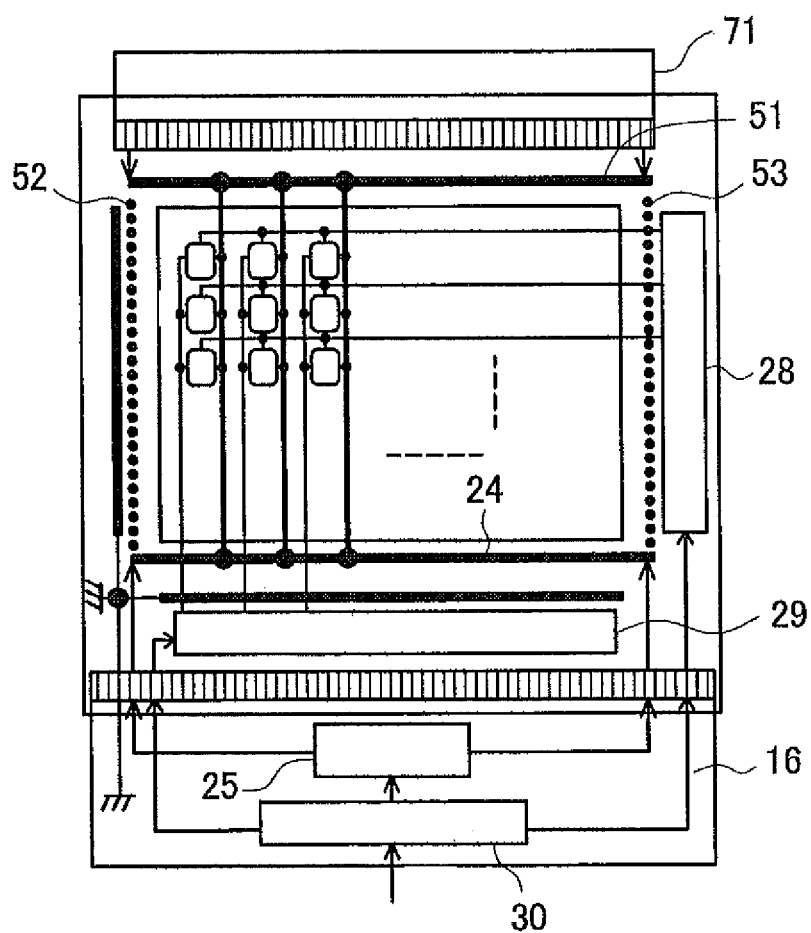
FIG. 7 is a drive circuit diagram of an organic EL display device of the fifth embodiment.

FIG. 7 is a drive circuit diagram of an organic EL display device of an embodiment 5 corresponding to FIG. 5 showing the embodiment 3. The constitution which makes this embodiment differ from the embodiment 3 lies in that a drive circuit includes an upper FPC 71 which supplies electricity from both ends of the upper power source bus line 51. Since other constitutions are substantially equal to the corresponding constitutions shown in FIG. 5, the detailed explanation is omitted.

In FIG. 7, a power source part substantially equal to a power source part 25 on a lower FPC 16 side is provided to an upper FPC 71 side, and electricity is supplied to both ends of the upper power source bus line 51 from this power source part on the upper FPC 71 side. The line resistance of the upper power source bus line 51 is reduced in the same manner as a lower power source bus line 24. Here, a left power source bus line 52 and a right power source bus line 53 which connect the upper power source bus line 51 and the lower power source bus line 24 may be omitted.

In this embodiment, compared to the embodiment 3, the brightness inclination in the horizontal direction can be further reduced.

Embodiment 6

Figure 8:
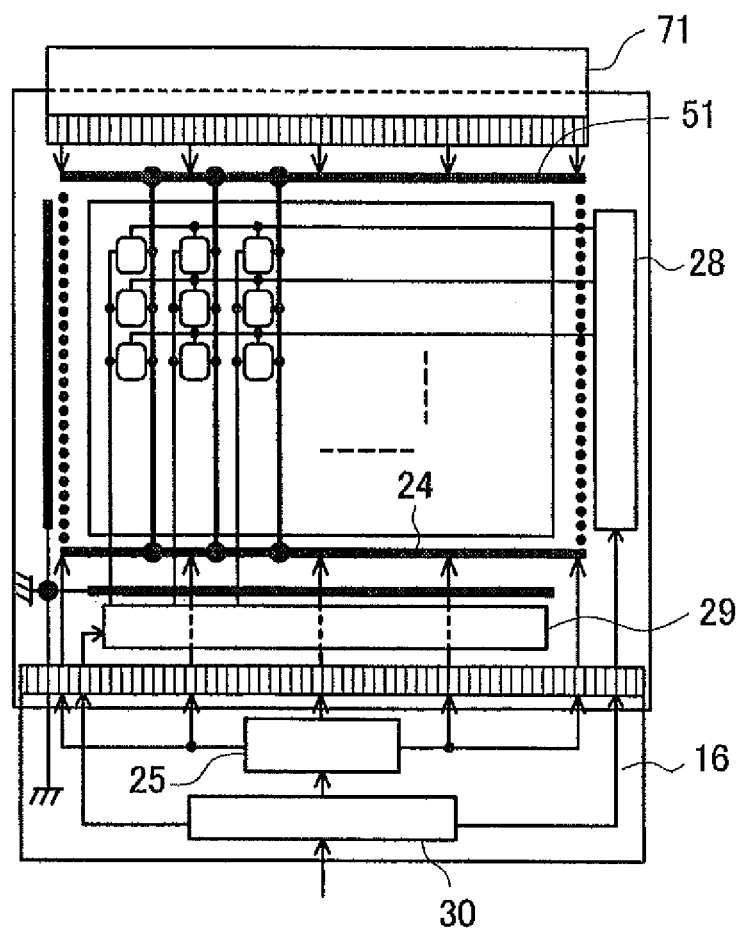
FIG. 8 is a drive circuit diagram of an organic EL display device of the sixth embodiment.

FIG. 8 is a drive circuit diagram of an organic EL display device of an embodiment 6 corresponding to FIG. 6 showing the embodiment 4. The constitution which makes this embodiment differ from the embodiment 4 lies in that a drive circuit includes an upper FPC 71 which supplies electricity to a plurality of portions including both ends of an upper power source bus line 51. Since other constitutions are substantially equal to the corresponding constitutions shown in FIG. 6, the detailed explanation is omitted.

In FIG. 8, a power source part substantially equal to a power source part 25 on a lower FPC 16 side is provided to an upper FPC 71 side, and electricity is supplied to a plurality of portions (five portions) including both ends of the upper power source bus line 51 from this power source part on the upper FPC 71 side. The line resistance of the upper power source bus line 51 is reduced in the same manner as a lower power source bus line 24.

In this embodiment, compared to the embodiment 4, the brightness inclination in the horizontal direction can be further reduced.

Embodiment 7

Figure 9:
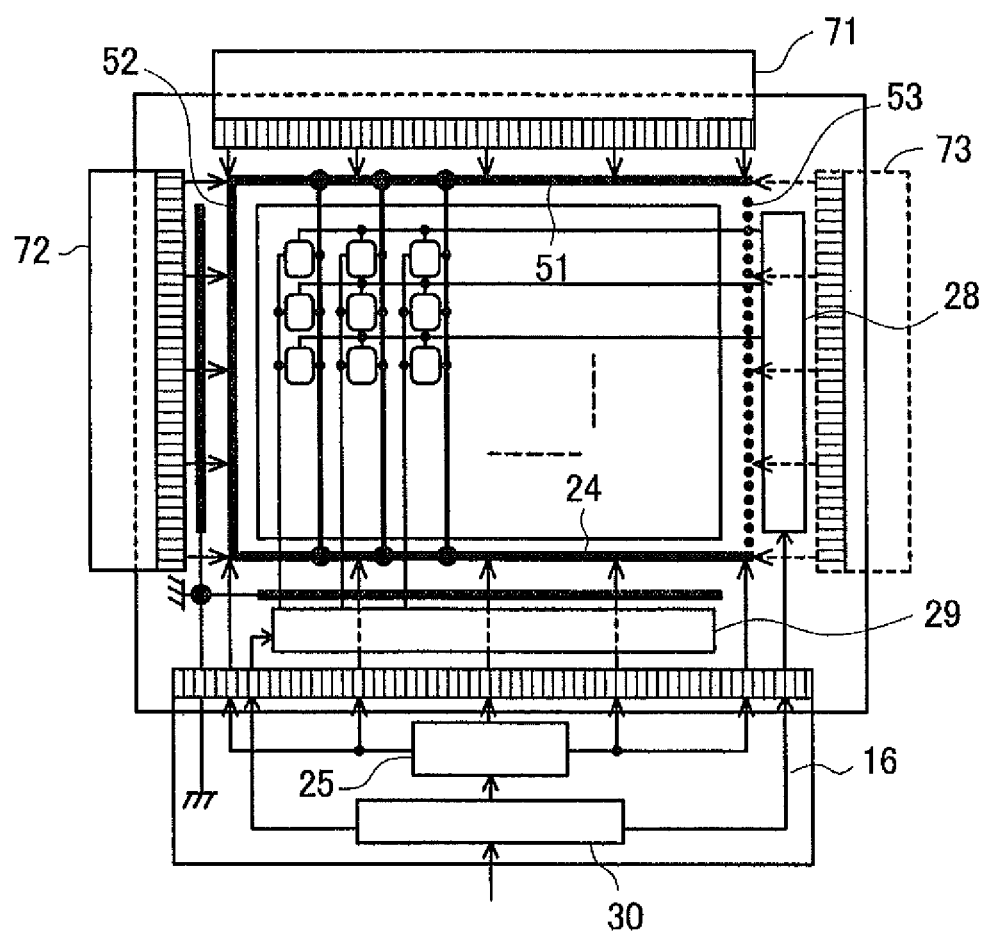
FIG. 9 is a drive circuit diagram of an organic EL display device of the seventh embodiment.

FIG. 9 is a drive circuit diagram of an organic EL display device of an embodiment 7 corresponding to FIG. 8 showing the embodiment 6. The constitution which makes this embodiment differ from the embodiment 6 lies in that left and right power source bus lines 52, 53 are provided with left and right FPCs 72, 73. Since other constitutions are substantially equal to the corresponding constitutions shown in FIG. 8, the detailed explanation is omitted.

In FIG. 9, a power source part substantially equal to a power source part 25 on a lower FPC 16 side is provided to an upper FPC 71 and a left FPC 72 (and a right FPC 73), and electricity is supplied to a plurality of portions (five portions) including both ends of an upper power source bus line 51 and a left power source bus line 52 (and a right power source bus line 53) from these power source parts. The line resistances of these upper power source bus line 51 and left power source bus line 52 (and right power source bus line 53) are reduced in the same manner as a lower power source bus line 24.

In this embodiment, the line resistances of the upper, lower, left and right power source bus lines can be reduced and hence, the brightness inclination attributed to the power source bus lines can be reduced to extremely small values.

We claim:

1. An organic EL display device comprising:
   a substrate;
   a display region having a plurality of pixels each including an EL element;
   a scanning line drive circuit along an edge of the substrate;
   a plurality of power source bus lines outside the display region; and
   a cathode contact part outside the display region, wherein the display region comprises:
      a first side along the scanning line drive circuit;
      a second side adjacent to the first side and running in a direction intersecting the first side;
      a third side at an opposite side of the display region from the first side;
      a fourth side at an opposite side of the display region from the second side;
      a scanning line electrically connected to the scanning line drive circuit;
      a data line running in a direction intersecting the scanning line; and
   a power source line running in a direction intersecting the scanning line,
   an anode of the EL element is configured to be supplied with an electric power from the power source line,
   the power source line is electrically connected to the plurality of power source bus lines at a plurality of portions,
   a constant voltage is applied to a cathode of the EL element via the cathode contact part,
   the plurality of power source bus lines has a first portion along the second side, and
   a second portion along the fourth side, and the cathode contact part has a third portion along the third side.

2. The organic EL display device according to claim 1, wherein each of the first side, the second side, the third side and the fourth side is formed by the pixels arranged at an outermost of the display region.

3. The organic EL display device according to claim 1, wherein the cathode contact part further comprises a fourth portion running in a direction intersecting the third portion and electrically connected to the third portion.

4. The organic EL display device according to claim 1, wherein each of the plurality of power source bus lines is running in a direction intersecting the power source line.

5. The organic EL display device according to claim 1, wherein the power source line is electrically connected to the plurality of power source bus lines at end portions of the power source line.

6. The organic EL display device according to claim 1, further comprising a flexible printed circuit, wherein the flexible printed circuit is mounted along another edge of the substrate running in a direction intersecting the edge of the substrate.

7. The organic EL display device according to claim 6, the power source line is electrically connected to a first terminal of the flexible printed circuit via the plurality of power source bus lines, and the cathode of the EL element is electrically connected to a second terminal of the flexible printed circuit outside of the first terminal of the flexible printed circuit via the cathode contact part.

8. The organic EL display device according to claim 1, further comprises a display control part supplying a scanning signal to the scanning line.

9. An organic EL display device comprising:
   a substrate having a first edge, a second edge adjacent to the first edge, a third edge at an opposite side of the substrate from the first edge, and a fourth edge at an opposite side of the substrate from the second edge;
   a display region having a plurality of pixels, each of which has an EL element;
   a scanning line drive circuit along the first edge of the substrate;
   a plurality of power source bus lines outside the display region; and
   a cathode contact part outside the display region,
   the display region comprises:
      a first side along the first edge;
      a second side along the second edge;
      a third side along the third edge;
      a fourth side along the fourth edge;
      a scanning line along the second side;
      a data line along the first side; and
      a power source line along the first side, wherein
   the power source line is electrically connected to the plurality of power source bus lines at a plurality of portions,
   a constant voltage is applied to a cathode of the EL element via the cathode contact part,
   the plurality of power source bus lines has a first portion between the second side and the second edge, and a second portion between the fourth side and the fourth edge, and
   the cathode contact part has a third portion between the third side and the third edge.

10. The organic EL display device according to claim 9, wherein each of the first side, the second side, the third side and the fourth side is formed by the pixels arranged at an outermost of the display region.

11. The organic EL display device according to claim 9, wherein the cathode contact part further comprises a fourth portion running in a direction intersecting the third portion and electrically connected to the third portion.

12. The organic EL display device according to claim 9, wherein each of the plurality of power source bus lines runs in a direction intersecting the power source line.

13. The organic EL display device according to claim 9, wherein the power source line is electrically connected to the plurality of power source bus lines at end portions of the power source line.

14. The organic EL display device according to claim 9, further comprising a flexible printed circuit mounted along the second edge of the substrate, wherein
   the power source line is electrically connected to a first terminal of the flexible printed circuit via the plurality of power source bus lines, and
   the cathode of the EL element is electrically connected to a second terminal of the flexible printed circuit outside of the first terminal of the flexible printed circuit via the cathode contact part.

15. The organic EL display device according to claim 9, further comprises a display control part supplying a scanning signal to the scanning line.

16. An organic EL display device comprising:
   a substrate;
   a display region having a plurality of pixels each including an EL element;
   a scanning line drive circuit along an edge of the substrate;
   a plurality of power source bus lines outside the display region;
   a cathode contact part outside the display region,
   a scanning line in the display region;
   a power source line running in a direction intersecting the scanning line;
   a scanning line drive circuit running in the same direction as the power source line and is electrically connected to the scanning line;
   a cathode contact part electrically connected to a cathode of the EL element; and
   a plurality of power source bus line running in a direction intersecting the power source line, wherein
   an end portion of the power source line is electrically connected to one of the plurality of power source bus lines,
   another end portion of the power source line is electrically connected to another of the plurality of power source bus lines,
   the display region is between the one of the plurality of power source bus lines and the another of the plurality of power source bus lines, and
   the display region is between the scanning line drive circuit and the cathode contact part.

17. The organic EL display device according to claim 16, further comprises a flexible printed circuit, wherein
   the power source line is electrically connected to a first terminal of the flexible printed circuit via the plurality of power source bus lines, and
   the cathode of the EL element is electrically connected to a second terminal of the flexible printed circuit outside of the first terminal of the flexible printed circuit via the cathode contact part.

18. The organic EL display device according to claim 16, further comprising a flexible printed circuit mounted along the second edge of the substrate.

* * * * *